United States Patent [19]

Feintuch

[11] 4,038,536

[45] July 26, 1977

[54] ADAPTIVE RECURSIVE LEAST MEAN SQUARE ERROR FILTER

[75] Inventor: Paul L. Feintuch, Covina, Calif.

[73] Assignee: Rockwell International Corporation, El Segundo, Calif.

[21] Appl. No.: 671,889

[22] Filed: Mar. 29, 1976

[51] Int. Cl.² .................... G06F 15/34; H04B 3/04
[52] U.S. Cl. .............................. 235/152; 328/167; 333/18; 333/70 T
[58] Field of Search .............. 235/152, 156; 325/38 B, 325/42; 328/167; 333/18, 28 R, 70 T; 179/170.2

[56] References Cited

U.S. PATENT DOCUMENTS

| 3,508,172 | 4/1970 | Kretzmer et al. | 333/18 |
| 3,646,480 | 2/1972 | Spaulding | 333/70 T X |
| 3,648,171 | 3/1972 | Hirsch | 333/18 X |
| 3,715,670 | 2/1973 | Hirsch et al. | 333/18 X |
| 3,755,738 | 8/1973 | Gitlin et al. | 325/42 |
| 3,974,449 | 8/1976 | Falconer | 333/18 X |

Primary Examiner—Jerry Smith
Attorney, Agent, or Firm—H. Fredrick Hamann; Rolf M. Pitts; George Jameson

[57] ABSTRACT

An adaptive recursive filter is disclosed which, in a preferred embodiment, comprises first and second adaptive transversal filters selectively coupled together to minimize the mean square error of the output data of the recursive filter based upon observations of input data to the recursive filter. Each transversal filter includes a tapped delay line with a variable weight on each tap. The output data of the recursive filter is developed by combining the outputs of the first and second transversal filters. The input data is applied to the first transversal filter, while the output data is applied to the second transversal filter. The output data is also combined with a reference signal to provide an error signal. A function of that error signal is utilized to update the weights of all of the taps in both transversal filters in order to cause the weights to automatically adapt themselves to minimize the mean square error of the output data of the recursive filter.

17 Claims, 2 Drawing Figures

ADAPTIVE RECURSIVE LEAST MEAN SQUARE ERROR FILTER

BACKGROUND OF THE INVENTION

1. Field of the Invention

This invention relates to electronic filters and particularly to an adaptive recursive filter which, by observing the input data to the recursive filter and using the least mean square error criterion, automatically updates weight vectors by using a simple iterative gradient search procedure in order to minimize the mean square error of the output data of the adaptive recursive filter.

2. Description of the Prior Art

Many types of prior art filters or filter systems have been proposed for filtering out or minimizing the errors caused by distortion or contamination of data introduced into that data when that data is transmitted through a transmission medium or channel, such as a radio propagation path, telephone lines, a cable television network, or a waterway. The contamination of the transmitted data can be caused by, for example, noise amplitude distortion, delay distortion, interference, data dispersion and redundant information. The data received from the transmission medium is rarely the same as the pre-transmitted data, due to the corruption of the data by the transmission medium. As a result, various devices and techniques have been utilized or proposed to minimize or compensate for the undesired effects of such data contamination or distortion.

In one type of system, if the characteristics of the transmission medium are known, the minimization of the distortion of the data by the transmission medium can be accomplished by predistorting the data to be transmitted in a way such that the additional distortion by the transmission medium alters the predistorted data signal to produce a received signal having the desired waveshape. However, use of this technique is limited to those situations where the characteristics of the transmission medium are constant and known in advance.

In another type of system, not only must the characteristics of the transmission medium be constant and known in advance, but much information must be known in advance about the data being transmitted and about the parameters that are to be extracted or estimated from the transmitted data. If these are known in advance, the entire filter system or filter device at the receiver end can be designed in advance with fixed, non-variable components to perform a desired function or operation. In such a case, a fixed parameter transversal filter or a fixed parameter recursive filter may be utilized to minimize the distortion and achieve the desired operation. Since a fixed parameter filter is designed for a particular situation or operation, any changes that may occur in the transmission medium or transmitted data will detrimentally affect the performance of the filter in the operation for which it was designed.

Such stability and pre-knowledge of the transmission medium characteristics, as well as pre-knowledge of the transmitted data and parameters to be extracted from such data, is often not found or known in advance. This is due to the fact that the transmission medium characteristics are either unknown or changing and/or advance information on the data being transmitted is unknown or in doubt. However, the received data may still have to be filtered to obtain certain properties of the received data that can still be utilized, even though, for example, particular values of the data are unknown.

As a result, for these applications, an adaptive filter may be needed to meet one or more operational requirements or functions. Generally an adaptive filter simultaneously estimates what is required to minimize the errors in the received data, based on observations of the data itself and some iterative procedure which converges to what the best filter would have been for a desired function. So basically, an adaptive filter selects its parameter values based on observations of the incoming or received data. Many types of adaptive filters have been proposed.

In U.S. Pat. No. 3,750,024 (Dunn et al) an adaptive filter is used in each of the transmitter and receiver portions of the overall system. A transmit filter in the transmitter monitors samples of the input signal to be transmitted in order to determine redundant information in the input signal and then removes the redundant information to produce a residual signal. At least one parameter of the redundant information is also determined. This parameter and the residual signal are multiplexed for transmission. The transmitted signal is demultiplexed in a receiver, with the resultant parameter and residual signal being used to control the operation of a receive filter and hence the subsequent reconstruction of the speech for utilization. In this system the transmit filter uses only input samples. No feedback path is provided between the output of the transmitter and the transmit filter to modify any filter parameters. As taught in Dunn et al, the digitally converted speech information is directly processed to develop the redundant information which is subtracted from the digitally converted speech. The filter coefficients in Dunn et al are developed by directly analyzing the speech information. More specifically, the filter coefficients are adjusted to the input signal by computing a short term correlation function from the input samples. The best fit of the filter's response to the input spectrum is obtained by minimizing the mean square value of the output signal of the transmit filter with respect to each of the weights to subsequently lead to the optimum weights. Inverse filters are used in both the transmitter and receiver of this system. No recursive filters are used in this system.

An article by Atal and Schroeder is referenced in Column 2, line 50 et seq. of Dunn et al. This article deals with a predictive quantizer system which, like that of Dunn et al, uses short term correlation in its system operation. The system in the cited article uses only output samples to drive the predictor, whereas the system of Dunn et al uses only input samples. Neither of these systems utilizes both input and output samples in its operation.

Another approach is briefly described in Column 5, line 8 et seq. of Dunn et al, wherein a prior art system is described as monitoring the level of the prediction and comparing it to the level of the input signal. In this approach, if the level of the prediction is not less than the level of the input signal with which it is being compared, the system assumes something is wrong, and forces the prediction to zero at that time. There appear to be two ways of forcing the prediction to zero. The system can either force all filter states to zero or force all filter coefficients to zero in order to zero the prediction. However, as indicated in Column 5, lines 14–17 of Dunn et al, this operation would diminish the advantage of having the prediction in the first place. It would further act to increase the error in the final output during the time that the system is forcing the prediction to zero, since nothing would be compared to the level of the input signal at that time.

Another system is described in U.S. Pat. No. 3,745,562 (Rosenbaum). Rosenbaum teaches an analog-to-digital encoder which uses an N dimensional quantizer to generate, from an input analog signal, N digits of an output code for transmission. An error signal, derived from past and future inputs, is applied to a tapped delay line, the outputs of which are multiplied by a coefficient for correcting errors in the input signal. However, the error signal is not utilized to adjust filter parameters.

Another technique to automatically correct for distortion introduced into a transmission medium involves the use of adaptive transversal filters or equalizers. An adaptive transversal filter comprises a tapped delay line and a plurality of multipliers, each associated with a single tap of the delay line. Each of the multipliers adjusts the amplitude and polarity of the signal obtained from the delay line at its associated tap. The outputs of these multipliers are then summed to provide the transversal filter output. By appropriate selection of the tap intervals and the multiplication factors, or tap gains, associated with each of the taps, the transversal filter may be used to accomplish intersymbol interference cancellation. That is, by selecting the amplitude characteristics of the multipliers to correspond to, for example, the impulse response characteristics of the transmission medium or line being used, the transversal filter effectively eliminates the ring-out associated with a digital pulse transmitted over the line. Many adaptive transversal filters or systems utilizing adaptive transversal filters have been devised to adjust automatically or adaptively the tap gains of the transversal filter such that some performance criterion is satisfied. Some examples of such transversal equalizer systems may be found in U.S. Pat. Nos. 3,368,168; 3,414,819; 3,414,845; 3,571,733; 3,651,316; 3,694,752; 3,708,766; 3,727,153; 3,736,414; 3,809,923; and 3,864,632. Most of these systems involve iterative methods, such as various gradient methods of equalization, which may be applied in the time domain or in the frequency domain. A non-iterative method may also be utilized. The difference between the iterative and non-iterative methods is that the iterative method uses signal samples both before and after the equalization, while the non-iterative method uses only the signal samples before the equalization.

A different type of adaptive transversal filter is described by B. Widrow in the article "Adaptive Filters", in *Aspects of Networks and System Theory*, ed. R.E. Kalman and N. De Claris, Holt, Reinhart and Winston, New York, 1970. In this article Widrow describes an adaptive transversal filter which, based upon observations of the input data, and a reference waveform correlated with some component of the input data, utilizes a least mean square error criterion to cause his adaptive transversal filter to converge. Thus, Widrow with his least mean square error criterion adjusts the weighted taps in his transversal filter to converge on the average to an estimate of the Wiener Filter which, in turn, is a relatively standard filter in the theory of filter design.

The problem with all of the previously discussed and identified transversal filters, including Widrow's adaptive transversal filter, is that such transversal filters are limited to have a finite impulse response. This finite impulse response is due to the fact that transversal filters can only produce zeros, and no poles, in the filter transfer function.

A transversal filter can only produce zeros, or zero gains at certain frequencies. It cannot have an essentially infinite gain at any frequency. In addition, the largest gain that a transversal filter can produce is a function of how many taps that the filter has. There are applications where it may be necessary to have points in the transfer function of a filter that have essentially infinite gains at one or more particular frequencies. In filter theory these high gain points are called "poles". The inability of a transversal filter to develop poles limits its usefulness in various applications. For example, the fact that a transversal filter can only produce zeros, and not poles, limits the capability of adaptive transversal filters when performing broadband noise cancellation, for which a channel transfer function which has zeros may have to be inverted.

Another prior art type of filter which could be used to correct for distortion is a non-adaptive, fixed parameter recursive filter. One type of non-adaptive, fixed parameter recursive filter is described in U.S. Pat. No. 3,703,632. The filter coefficients in this patent are stored in a memory from an unknown external source, while the input data is stored in another memory. A particular sequence of computation is disclosed wherein the stored filter coefficients and stored input data are selectively read out of the two memories to produce two separate signals in two separate channels, with the products of these two separate signals being sequentially formed in a multiplier. The plurality of product outputs from the multiplier are then summed in an accumulator to develop an output signal, which can then be restored back into data memory unless new data is to be written into the data memory. No means are provided in this system for making this recursive filter automatically and internally adapt to unknown or changing conditions in the transmission medium which may affect the input data, since this patent neither teaches nor even suggests a means of computing the filter coefficients.

Fixed parameter filters, whether recursive or transversal, are well known in the prior art and do not have an iterative process that needs to converge. An iterative process involves a means or implementation by which the weight on each tap is derived.

A second type of known non-adaptive, fixed parameter recursive filter comprises two transversal tapped delay line filters which, in combination, transversely filter the input data and then subsequently filter the output data of the recursive filter. Essentially, this is the canonical form of a recursive filter, which is well known in the art. A recursive filter can produce zeros, or finite impulse responses, with a feed-foward network, and poles, or infinite impulse responses, with a feed-back network. However, the applicability of a fixed parameter recursive filter is limited, because a design of the fixed parameters requires detailed statistical knowledge of the transmitted signals and the channel effects, just as in the fixed parameter transversal filter. These properties are often changing and, in general, are not known. To make a recursive filter a useful and powerful tool in minimizing or eliminating distortion in data signals received from an unknown or changing transmission medium, the recursive filter had to be made adaptive. The prior art difficulty in making a recursive filter adaptive was due to the fact that the convergence requirements for making the recursive filter adapt were unknown. On the other hand, transversal filter structures could be readily implemented because their convergence requirements were known.

Another type of adaptive filter is therefore an adaptive recursive filter, which is a comparatively recent development in the art. An adaptive recursive filter is much more powerful in minimizing distortion introduced into data by a transmission medium than a transversal filter, because the adaptive recursive filter has both poles and zeros whereas, as previously stated, the transversal filter has only zeros. The means used to adaptively adjust the tap gains is one of the basic features which distinguishes one adaptive recursive filter from another and, of course, from a non-adaptive, fixed parameter recursive filter. An adaptive recursive filter automatically designs itself to compute and adjust its tap weights or gains, to minimize some desired design criterion, based upon observations of the input data. Changes in the transmission medium or received data are automatically tracked by causing the tap weights to automatically change to minimize the desired design criterion. Consequently the adaptive recursive filter automatically adapts itself to these changes.

As a result, the means used to automatically adjust the tap gains or weights may be based upon the desired design criterion designed into the adaptive recursive filter. Therefore, the iterative procedure or operation, performed by the adaptive recursive filter, will converge to the solution that satisfies the desired design criterion of the filter. However, it should be noted that, although the adaptive recursive filter may be specifically designed to satisfy a desired design criterion, the filter may also satisfy other criteria as well. Examples of desired design criteria that adaptive recursive filters could be particularly designed to minimize are: to minimize the distortion introduced by the transmission medium; to minimize intersymbol interference in the transmission medium; and to use a deterministic point-wise instantaneous error criterion to automatically minimize the instantaneous error in the output data.

One known type of adaptive recursive filter is described in U.S. Pat. No. 3,716,807, which is entitled "Recursive Automatic Equalizer and Method of Operation Therefore". In this patent the filter is essentially designed to minimize line distortion and intersymbol interference in the sidelobes of the data pulse transmitted through a communications channel. The operation of this recursive equalizer system is basically directed to channel equalization by dealing primarily with the front and rear sidelobes of the pulse rather than the general filtering function of designing a processor to automatically minimize an error criterion based on the input data. The means of adjusting the tap gains of this equalizer system is a direct realization of the mathematical consequences of: (1) generating an error signal for the front part or front sidelobe of the pulse (not for an arbitrary waveform), (2) sequentially applying transversal filtering several times by using a plurality of cascaded equalizer stages in FIG. 1B, (3) generating an error signal for the rear part or rear sidelobe of the pulse (not for an arbitrary waveform), and (4) generating tail cancellation signal terms in FIG. 1C to correct the pulse. As indicated above, different error signals are utilized to respectively control the front end equalizer (FIG. 1B) and the rear end equalizer (FIG. 1C) of the equalizer system shown in FIG. 1A. In the operation of this equalizer system the feed-forward and feed-back circuits do not operate simultaneously. In the operation of FIG. 1B, the front sidelobe of the input pulse or signal is reduced to substantially zero distortion by adjusting the tap settings of successive or cascaded equalizer stages after successive iterations. After n iterations, the output signal from FIG. 1B is applied to FIG. 1C where it is modified by the reciprocal of a preselected function to substantially reduce the rear sidelobe distortion of the input signal which is to be equalized. It should be noted that both multiple feed-forward and multiple feed-back circuits are utilized in the system. It should be further noted that a non-detailed block diagram of one of the "tap adjusting means" 16, which are utilized in the front end equalizer of FIG. 1B and rear end equalizer of FIG. 1C is illustrated in FIG. 1D. In connection with the description of FIG. 1D, column 9, lines 32–33 of this U.S. Pat. No. 3,716,807, states that a detailed explanation of the tap adjust drive (22 of the tap adjusting means 16) is unnecessary. As stated previously in this application, the means used to adaptively adjust the tap gains is one of the basic features which distinguishes one adaptive recursive filter from another.

Another known type of adaptive recursive filter has recently been invented by S. A. White. This adaptive recursive filter is described in U.S. patent application Ser. No. 632,119, filed on Nov. 14, 1975. Furthermore, this adaptive recursive filter is also described by S. A. White in his article entitled "An Adaptive Recursive Digital Filter", in the publication *Conference Proceedings, Ninth Asilomar Conference on Circuits, Systems, and Computers* (January 1976). S. A. White's adaptive recursive filter utilizes a deterministic point-wise instantaneous error criterion to implement an algorithm to automatically adjust the tap gains, or filter coefficients, in accordance with the minimization of the instantaneous error criterion. By this means, S. A. White's adaptive recursive filter converges to a solution to satisfy this instantaneous error criterion which, as indicated previously, is a deterministic criterion. More specifically, the means for adjusting the tap gains of the filter, which is tracking an arbitrary waveform, is a direct realization of the mathematical consequences of (1) establishing a performance criterion, (2) generating an error signal, (3) computing the contribution of each tap gain error to the overall error signal, and (4) using the above three factors to selectively compute the corrections to be applied to the respective tap gains. In this filter a steepest descent method is used to adjust the values of the filter coefficients. This criterion states that the filter coefficient which contributes the greatest error should be the filter coefficient or parameter which is most quickly corrected, while filter coefficients which contribute less to the error may be corrected more slowly.

None of the above-described or listed prior art filters or filter systems teaches an adaptive recursive least means square error filter which utilizes a least means square error criterion and updates weight vectors using a simple iterative gradient search procedure.

SUMMARY OF THE INVENTION

Briefly, an improved adaptive recursive filter, which utilizes a least mean square error criterion, is provided for minimizing the mean square error of the output data of the adaptive recursive filter based upon observations of the input data to the recursive filter. This least mean square error criterion is a statistical error criterion, as distinguished from the deterministic instantaneous error criterion of S. A. White. By this means this improved adaptive recursive filter coverges to a solution that satisfies this statistical least mean square error criterion.

In a preferred embodiment, first and second adaptive transversal filters are selectively coupled together to provide both poles and zeros in the transfer function of the recursive filter. The first adaptive transversal filter is a feed-forward structure which develops the zeros, while the second adaptive transversal filter is a feedback structure which develops the poles in the transfer function. The output data of the adaptive recursive filter is developed by combining the outputs of the first and second transversal filters. Input data to the adaptive recursive filter is applied to the first transversal filter, while the output data of the recursive filter is applied to the second transversal filter. The output data of the recursive filter is also combined with a reference signal to provide an error signal. In this embodiment of the invention a simple scalar function of that error signal is utilized to update or adjust the gain weightings of the taps in both transversal filters to follow an iterative gradient search (i.e. method of steepest descent) so as to minimize the mean square error of the output data of the adaptive recursive filter.

It is therefore an object of this invention to provide an improved, relatively simple, compact and economical, adaptive recursive filter.

Another object of this invention is to provide an improved digital adaptive recursive filter.

Another object of this invention is to provide an adaptive recursive filter which designs itself, based upon observations of the input data, to track time varying parameters in the input data even though the properties of the input data are unknown.

Another object of this invention is to provide an adaptive recursive filter which automatically designs itself based upon a minimum mean square error criterion.

Another object of the invention is to provide an adaptive recursive filter which is based upon the utilization of the minimization of a mean square error criterion.

Another object of this invention is to provide an adaptive recursive filter which utilizes adaptive transversal filters to produce both zeros and poles.

Another object of this invention is to provide an adaptive recursive filter comprised of a pair of transversal filters in which the gain weightings of the transversal filters are automatically adjusted to follow the iterative gradient search in order to minimize the mean square error of the output data of the adaptive recursive filter.

Another object of this invention is to selectively couple two transversal filters together to provide an adaptive recursive filter whose output data is combined with a reference signal to generate an error signal, the function of which error signal is used to automatically update the weights of all of the taps in both transversal filters.

Another object of this invention is to selectively couple two transversal filters together to provide an adaptive recursive filter whose output data is combined with a reference signal to generate an error signal, whereby a first function of the error signal is used to automatically update all of the tap weights of one of the transversal filters, while a second function of the error signal is used to automatically update all of the tap weights of the other one of the transversal filters.

A further object of this invention is to provide an adaptive recursive filter which, by observing the input data to the recursive filter and using the least mean square error criterion, automatically updates weight vectors by using a simple iterative gradient search procedure in order to minimize the mean square error of the output data of the adaptive recursive filter.

BRIEF DESCRIPTION OF THE DRAWINGS

These and other objects, features and advantages of the invention, as well as the invention itself, will become more apparent to those skilled in the art in the light of the following detailed description taken in consideration with the accompanying drawings wherein like reference numerals indicate like or corresponding parts throughout the several views and wherein.

DESCRIPTION OF THE PREFERRED EMBODIMENT

Figure 1:
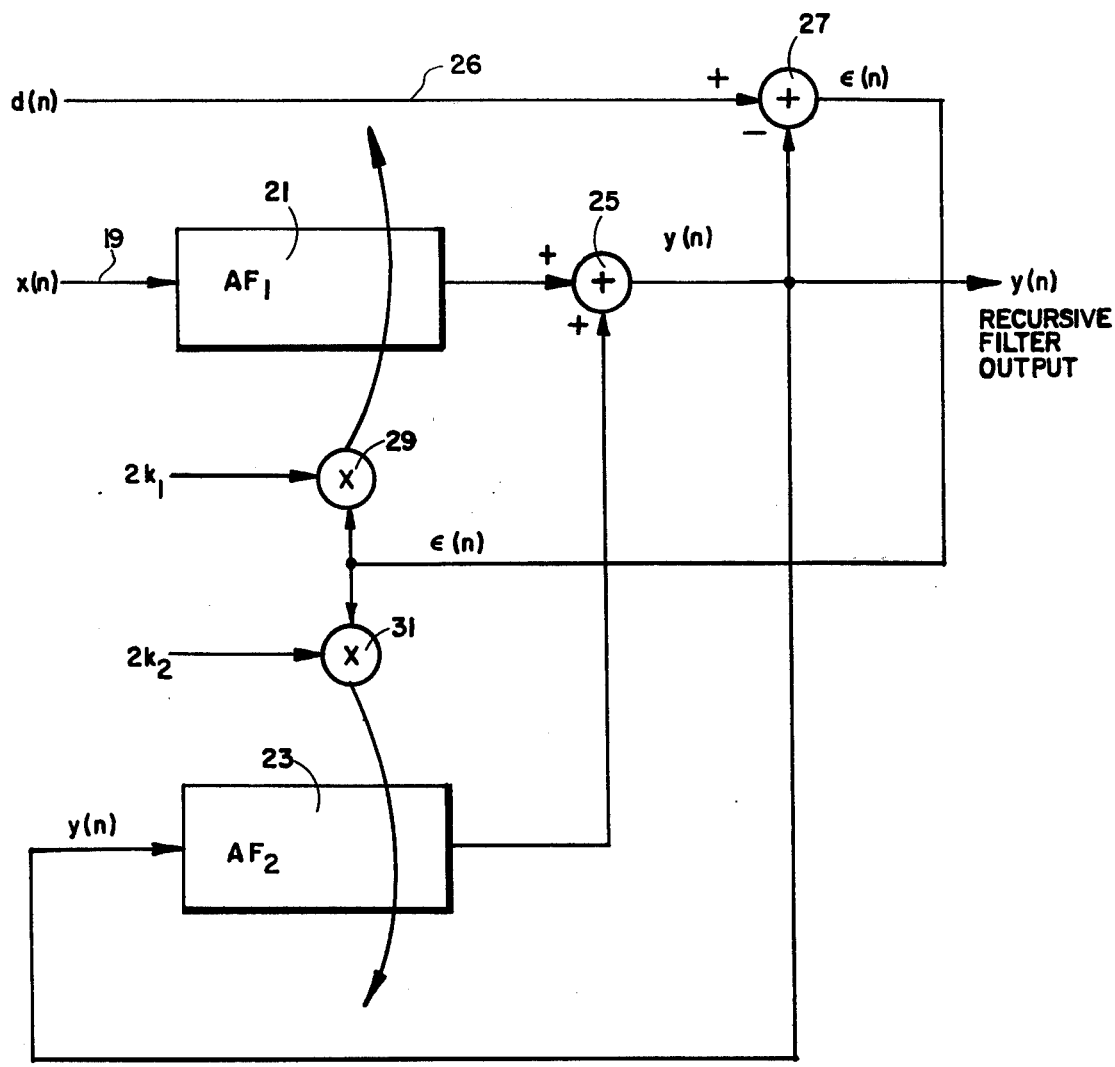
FIG. 1 is a simplified block diagram of a preferred embodiment of the invention.

Referring now to the drawings, FIG. 1 illustrates a simplified block diagram of a preferred embodiment of the invention. An input signal $x(n)$ is received by conductor 19 from some transmission medium or channel (not shown), such as a radio propagation path, a telephone line, a cable television network or a waterway. This input signal $x(n)$, which is the distorted output of the particular transmission medium or channel being utilized, is applied through the conductor 19 to the input of a first adaptive transversal filter ($AF_1$) 21. In response to $x(n)$, the filter 21 develops its output. The output signal $y(n)$ (to be explained) of the adaptive recursive filter of FIG. 1 is fed back to the input of a second adaptive transversal filter ($AF_2$) 23 to get refiltered by the filter 23. In response to $y(n)$, the filter 23 develops its output. The outputs of the transversal filters 21 and 23 are then combined or summed in a combiner or summer 25 to develop the adaptive recursive filter output $y(n)$.

Figure 2:
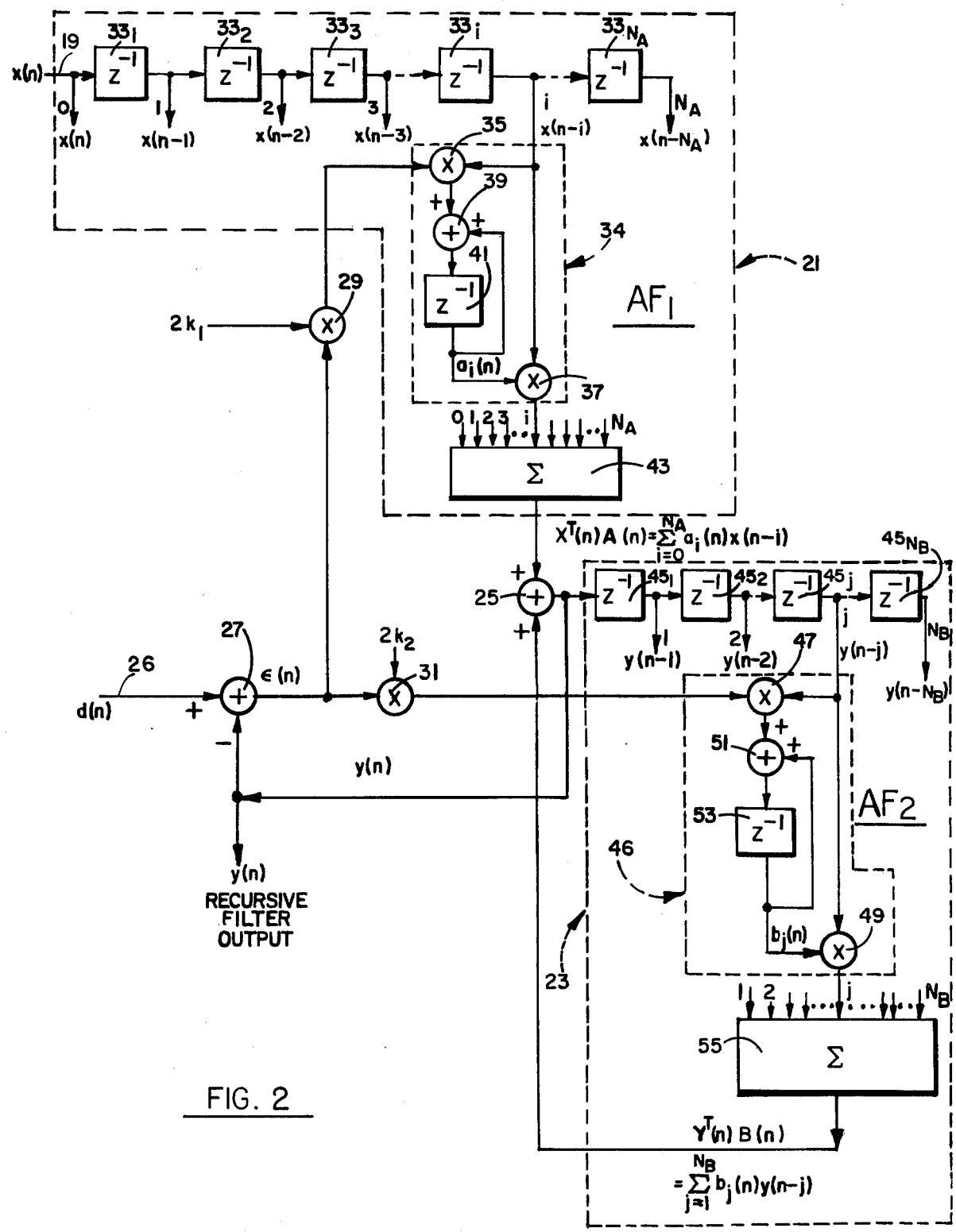
FIG. 2 is a more detailed block diagram of the preferred embodiment of FIG. 1.

It should be noted at this time, as is shown in FIG. 2 of the drawings, that each of the transversal filters 21 and 23 is essentially comprised of a tapped delay line to obtain various delays at the outputs of the taps of the particular signal applied to the transversal filter input, automatically adjustable weights respectively coupled to the taps to automatically vary the coefficients associated with the taps, and a summing circuit or summer to sum the weighted tap outputs to develop the transversal filter output.

A preselected input reference waveform or signal $d(n)$ is applied through a conductor 26 to a combiner or subtractor 27. The derivation of the input signal $d(n)$ depends on the physics of the specific problem or application that it is desired to solve. Examples of applications which determine the derivation of the signal $d(n)$ are well known in the prior art of adaptive filters. For example, an article by B. Widrow, J. Glover, J. McCool, J. Kaunwitz, C. Williams, R. Hearn, J. Zeidler, E. Dong and R. Goodlin, entitled "Adaptive Noise Cancelling: Principles and Applications", in Proc. IEEE, Vol 63, Dec. 1975, described various noise cancellation and line enhancing applications for obtaining the reference signal $d(n)$. As indicated previously, the use of an adaptive filter is based upon obtaining a meaningful reference signal $d(n)$ to solve a specific problem. Applicant's adaptive recursive filter can be used in any of the applications described in the above-noted article, as well as in other applications.

The adaptive recursive output $y(n)$ is subtracted in the combiner 27 from the preselected reference signal $d(n)$ to develop an error signal $\epsilon(n)$, which indicates any mismatch or difference between the $d(n)$ and $y(n)$ signals. This resultant error signal $\epsilon(n)$ is fed back to multipliers 29 and 31. Also, cnstants or scalar quantities $2k_1$ and $2k_2$ are respectively applied to the multipliers 29 and 31 to develop first and second functions, or scaled values, of the error signal $\epsilon(n)$. Although $\epsilon(n)$ is not necessarily a direct input to either of the filters 21 and 23, $\epsilon(n)$ is the key element that drives these filters to iterate. As noted by the arrows drawn from the multipliers 29 and 31 through the filters 21 and 23, these first and second functions are used to update all of the weighted taps in the filters 21 and 23.

More specifically, the first function of the error signal $\epsilon(n)$ is applied to the transversal filter 21 to automatically adjust or update all of the weights in that filter 21 to adaptively vary the coefficients associated with the taps in the filter 21. The coefficients being internally updated in the filter 21 are known as the feed-forward coefficients. In addition, the feed-forward coefficients are the numerator coefficients of the transfer function for the adaptive recursive filter which determine the zero values of the adaptive recursive filter. In a like manner, the second function of the error signal $\epsilon(n)$ is applied to the transversal filter 23 to automatically update all of the weights in that filter 23 to adaptively vary the coefficients associated with the taps in the filter. The coefficients being internally updated in the filter 23 are known as the feed-back coefficients, since they are contained in the output of the filter 23 which is summed with the output of the filter 21 in the combiner 25 to develop the recursive filter output $y(n)$. It will be recalled that the output signal $y(n)$ is fed back to the input of the filter 23. These feed-back coefficients are the denominator coefficients of the transfer function of the adaptive recursive filter which determine the pole values of the adaptive recursive filter.

It can therefore be seen that the commonly fed back error signal $\epsilon(n)$ is weighted or scaled to update the two transversal filters 21 and 23, or drive them to iterate, by changing the tap weights in those filters. By this means, each of the filter terms in the output of each of the filters 21 and 23 is corrected. FIG. 1 illustrates that two different scalars, $2k_1$ and $2k_2$, are used to scale the error signal $\epsilon(n)$ to produce two different functions to respectively update the filters 21 and 23. The quantities $2k_1$ and $2k_2$ must be selected to be within the numerical regions for which the adaptive recursive filter will be stable, i.e. the iterative procedure will converge. Within these regions, the values of $2k_1$ and $2k_2$ may be selected to regulate the rate at which the filter coefficients adapt.

Subject to the above convergence constraint, FIG. 1 can be slightly modified by, for example, eliminating the multiplier 31 and the scalar $2k_2$ and using only the one scalar $2k_1$ to scale the error signal $\epsilon(n)$. In this case, only the function of the error signal $\epsilon(n)$ that is developed at the output of the multiplier 29 would be utilized to update both of the filters 21 and 23. Furthermore, and still subject to the above convergence constraint, this modification of FIG. 1 may be carried one step further. When $2k_1$ can be set = 1, even the multiplier 29 and scalar $2k_1$ can be eliminated, with the error signal $\epsilon(n)$ being directly applied to both of the filters 21 and 23 to update them. So it can be seen that the invention can have three different embodiments: the first where $2k_1 \neq 2k_2$ and neither constant or scalar = 0; the second where only one constant or scalar is used and that constant $\neq 1$ or 0; and the third where the only constant or scalar used = 1, and hence the error signal $\epsilon(n)$ is commonly applied to both of of the transversal filters 21 and 23.

The significant simplification of this invention results from using a statistical criterion, namely, the least mean square criterion. By using the least square criterion in this invention, only one simple scaled error feed-back signal is applied to all of the adjustably weighted taps of each transversal filter (or both filters) of the recursive filterinstead of a vector of scalar feed-back signals for the respective taps. Therefore, in terms of hardware, this invention is easily implemented in relation to existing adaptive recursive filters. Also, by using the least means square criterion, the invention adaptively operates to minimize the mean square error in the recursive filter output signal $y(n)$.

One exemplary application of the invention (out of many other different applications) will now be described to basically illustrate the operation of the invention in relation to FIG. 1. Let us assume, in the field of medical practice, that an obstetrician suspects that there may be something wrong with the heartbeat of the fetus of a pregnant woman. The problem here is that the heartbeat of the pregnant woman would predominate over, and very possibly obscure, the heartbeat of the fetus, unless the heartbeat of the woman were cancelled out in some way. This invention could solve this medical problem in the following way. In this case $d(n)$ would be the electrocardiogram signal of the combined heartbeats of both the woman and fetus, as derived from the application of an electrocardigraph to the abdomen of the pregnant woman. Also, $x(n)$ would be the electrocardiogram signal of the woman alone, as monitored at the chest of the woman.

In the above exemplary application of the invention, the adaptive recursive filter of FIG. 1 would automatically operate to change its output signal $y(n)$ so that $y(n)$, as closely as possible in the mean square sense, would resemble the component of the signal $d(n)$ that would be due to the woman's heartbeat alone. The error signal $\epsilon(n)$ would therefore represent the fetal heartbeat by itself.

The above exemplary cancellation application of the invention is just one particular example of an application in which applicant's invention can be used. As discussed above, applicant's invention can also be used in any of the various noise cancellation and line enhancing applications that are described in the above-referenced article by B. Widrow et al, as well as in other applications.

Referring now to FIG. 2, a more detailed block diagram of the preferred embodiment of FIG. 1 is illustrated. As described previously, the signal $x(n)$ is applied through the conductor 19 to the filter 21, while the signal $y(n)$ is applied to the filter 23.

In relation to the filter 21, the signal $x(n)$ is applied to an output tap 0 at the input of a delay block $33_1$ to develop the undelayed signal $x(n)$ at that output tap. The signal $x(n)$ is also applied through a sequence of $Z^{-1}$ (one sample time delay) blocks $33_1, 33_2, 33_3 \ldots 33_i \ldots 33_{N_A}$ (which together form a delay line) to respectively develop the various sample time data delayed signals $x(n-1), x(n-2), x(n-3) \ldots x(n-i) \ldots x(n-N_A)$ at their output taps $1, 2, 3 \ldots i \ldots N_A$, respectively. The number $n$ represents the $n$th time instant or sample, and the number $N_A$ represents the last tap in the feed-forward filter 21.

Respectively coupled to the taps 0, 1, 2, 3 ... i ... $N_A$ are tap adjusting circuits, similar to the circuit 34, for updating the weights or coefficients in the feed-forward path A. The function of the error signal $\epsilon(n)$ at the output of the multiplier 29 is commonly applied to all of these tap adjusting circuits. Since the operation of these tap adjusting circuits is similar, only the operation of the tap adjusting circuit 34, which is connected to the ith tap, will now be explained.

The delayed data signal $x(n - i)$ from the ith tap is applied to each of the multipliers 35 and 37. The function of the error signal at the output of the multiplier 29 is multiplied by the delayed data signal $x(n - i)$ in the multiplier 35 to develop a weight update signal associated with the ith tap. This weight update signal, which at the present instant of time (n or now) is equal to $2k_1 \epsilon(n) x(n-i)$, is summed in a combiner or summer 39 with the present value (at time instant n) of the presently updated coefficient or weight $a_i(n)$ from the output of a one sample time delay block 41. It should be noted that the output of the summer 39 is the weight update signal $a_i(n + 1)$ at the present time n for the $a_i$ filter coefficient or weight that will occur at the next instant of time $(n + 1)$. The algorithm for determining the value of the updated weight or filter coefficient $a_i$ for the next instant of time is given by the equation:

$$a_i(n + 1) = a_i(n) + 2k_1 \epsilon(n) x(n - i), \quad (1)$$

the terms of which have been previously defined. The output of the summer 39 is applied to the input of the delay block 41.

During the nth instant of time the data signal $x(n - i)$ from the ith tap at the output of delay block $33_i$ is multiplied in the multiplier 37 by the presently updated value of the $a_i$ tap weight or coefficient $a_i(n)$. The output product of the multiplier 37 is then applied to the input ith tap of a combiner or summer 43, which has input taps 0, 1, 2, 3 ... i ... $N_A$. The remaining tap adjusting circuits (not shown), which are similar in structure and operation to the tap adjusting circuit 34 just described, in the filter 21 are respectively coupled between corresponding output taps of the tapped delay line formed by the combination of the delay blocks $33_1 \ldots 33_{N_A}$ and the input taps of the summer 43. For example, a tap adjusting circuit is coupled between output tap 0 and input tap 0, another tap adjusting circuit is coupled between output tap 1 and input tap 1, etc. The outputs of all these tap adjusting circuits (from multipliers a similar to the multiplier 37) are summed by the summer 43 to develop a signal $X^T(n)A(n)$ at the output of the feed-forward filter 21, where $X^T$ represents the transposition of the vector of the data signals developed at the output taps 0, 1 ... n ... $N_A$, and $A(n)$ represents the vector of the filter coefficients $a_1(n), a_2(n), a_3(n) \ldots a_i(n) \ldots a_{N_A}(n)$ developed at time instant n. Another way this could be stated is given by the following equation.

$$X^T(n)A(n) = \sum_{i=0}^{N_A} a_i(n) x(n - i) \quad (2)$$

As described previously, the outputs of the filters 21 and 23 are summed in the summer 15 to develop the output signal $y(n)$ at the nth time instant. The combined operation of the two transversal filters 21 and 23, in conjunction with the operation of the remaining circuits of FIG. 2, minimizes the mean square error of the output signal $y(n)$. This $y(n)$ signal is applied to the input of the filter 23. More specifically, the signal $y(n)$ is applied through a sequence of $Z^{-1}$ (one sample time delay) blocks $45_1, 45_2 \ldots 45_j \ldots 45_{N_B}$ (which together form a delay line) to respectively develop the various sample time delayed signals $y(n - 1), y(n - 2) \ldots y(n - j) \ldots y(n - N_B)$ at the output taps 1, 2 ... j ... $N_B$, respectively. The output tap $N_B$ represents the last tap in feedback filter 23. It should be noted that the number of output taps in the feed-forward path of the filter 21 does not have to be equal to the number of output taps in the feed-back path of the filter 23. As a result, the delayed signal $y(n - j)$ from the jth output tap of the filter 23 is illustrated (rather than the ith tap) as being applied to a tap adjusting circuit 46.

The tap adjusting circuit 46 of the filter 23 is comprised of multipliers 47 and 49, a combiner or summer 51 and a one sample time delay block 53, which are respectively similar in structure and operation to the multipliers 35 and 37, the summer 39 and the delay block 41 of the tap adjusting circuit 34 of the filter 21. As a result the tap adjusting circuit 46 needs no further description. It should be noted that the function $2k_2\epsilon(n)$ of the error signal $\epsilon(n)$ is applied from the multiplier 31 to multiply the signal $y(n - j)$ in the multiplier 47, instead of the function $2k_1\epsilon(n)$ which was used in filter 21. However, as mentioned before, where $2k_1 = 2k_2$ and neither is equal to one or zero, only one function, $2k_1\epsilon(n)$ or $2k_2\epsilon(n)$, can be used with both filters 21 and 23. Also, where $2k_1 = 2k_2 = 1$, the error signal $\epsilon(n)$ can be directly applied to both of the filters 21 and 23.

The output $b_j(n)$ of the delay block 53 is the updated feedback filter coefficient which is used by the multiplier 49 as the multiplier of the signal $y(n - j)$ from output tap j. The output of the multiplier 49 in the tap adjusting circuit 46 is fed to the input j th tap of a combiner or summer 55, which is similar to the summer 43 in the filter 21.

The summer 55 includes input taps 1, 2 ... j ... $N_B$. Tap adjusting circuits, similar to the circuit 46, are respectively coupled between output taps 1, 2 ... j ... $N_B$ of the delay blocks $45_1, 45_2 \ldots 45_j \ldots 45_{N_B}$ and input taps 1, 2 ... j ... $N_B$ of the summer 55. The algorithm that is used by the tap adjusting circuit 46 to develop the tap weight or filter coefficient $b_j$ at the next instant of time $(l + 1)$ is similar to that of Equation (1) above, and is defined by the following equation:

$$b_j(n + 1) = b_j(n) + 2k_2 \epsilon(n) v(n - j) \quad (3)$$

In a like manner, similar algorithms are developed by the other tap adjusting circuits in both of the filters 21 and 23. The summer 55 sums all of the outputs from the various tap adjusting circuits coupled thereto in order to develop an output signal, $Y^T(n)B(n)$, where $Y^T(n)$ represents the transposition of the vector of the signals $y(n - 1), y(n - 2) \ldots y(n - j) \ldots y(n - N_B)$, and $B(n)$ represents the vector of the feed-back filter coefficients $b_1, i\ b_2 \ldots b_j \ldots b_{N_B}B$ at the n th time instant. Another way this relationship can be expressed is given by the following equation:

$$Y^T(n)B(n) = \sum_{j=1}^{N_B} b_j(n) y(n - j) \quad (4)$$

So it can be seen that the structure and operation of the filter 23 is similar to those of the filter 21, with the exceptions of the possible differences in the number of output taps in the delay lines in the filters 21 and 23, the difference in the filter inputs and filter outputs, the fact that the output of the filter 23 is fed back to the input of the filter 23 by way of the summer 25, and the fact that the feed-back filter 23 does not contain a 0th tap as does the filter 21.

The remaining circuits in FIG. 2 have been explained in relation to FIG. 1 and, hence, require no further explanation. However, it should be understood that $x(n)$, $y(n)$, $d(n)$ and $\epsilon(n)$ respectively represent the input data signal, the recursive filter output signal, the preselected desired waveform $d(n)$ and the error signal $\epsilon(n)$, all at time instant $n$.

To further aid in the understanding of the operation of this invention, a theoretical derivation of the mathematics utilized in deriving the invention will now be given.

In the time domain the input-output relationship of a canonical recursive filter (not shown), having known statistics and fixed parameters, at the $n$th sampling instant of time can be described by the equation:

$$y(n) = \sum_{k=0}^{N} a_k x(n-k) + \sum_{k=1}^{N} b_k y(n-k) \quad (5)$$

where $k$ = the running index and $y(n)$ = the value of $y$ at the $n$ th sampling instant of time.

The set $\{a_k\}$ is referred to as the set of feed-forward coefficients and the set $\{b_k\}$ is referred to as the set of feed-back coefficients. In vector notation, let $$A = \begin{bmatrix} a_0 \\ a_1 \\ \vdots \\ a_k \\ \vdots \\ a_{N_A} \end{bmatrix} \text{ and } B = \begin{bmatrix} b_1 \\ \vdots \\ b_k \\ \vdots \\ b_{N_B} \end{bmatrix}, \text{ and} \quad (6)$$

$$X(n) = \begin{bmatrix} x(n) \\ x(n-1) \\ \vdots \\ x(n-k) \\ \vdots \\ x(n-N_A) \end{bmatrix} \text{ and } Y(n) = \begin{bmatrix} y(n-1) \\ \vdots \\ y(n-k) \\ \vdots \\ y(n-N_B) \end{bmatrix} \quad (7)$$

The equation (5) can be rewritten as follows, where the superscript T denotes vector transpose:

$$y(n) = A^T X(n) + B^T Y(n) \quad (8)$$

Further assume that this standard canonical recursive filter is used to estimate a desired waveform $d(n)$ in a minimum or least mean square error sense. Let $\epsilon(n)$ denote the error waveform at the $n$ th time sample, and $E(\cdot)$ denote the expectation operator. Then $$\epsilon(n) = d(n) - y(n) = d(n) - A^T X(n) - B^T Y(n) \quad (9)$$

$$E[\epsilon^2(n)] = E[d^2(n)] + A^T R_{xx} A + B^T R_{yy} B - 2 A^T R_{dx} - 2 B^T R_{dy} + 2 A^T R_{xy} B \quad (10)$$

where
- $R_{xx} = E[X(n) X^T(n)]$, an $(N_A + 1) \times (N_A + 1)$ matrix
- $R_{yy} = E[Y(n) Y^T(n)]$, an $N_B \times N_B$ matrix
- $R_{dx} = E[d(n) X(n)]$, an $(N_A + 1) \times 1$ column
- $R_{dy} = E[d(n) Y(n)]$, an $N_B \times 1$ column
- $R_{xy} = E[X(n) Y^T(n)]$, an $(N_A + 1) \times N_B$ matrix The theory of Wiener filtering employs known second order statistics to dictate the structure of the linear filter that minimizes the mean-square-error. For adaptive transversal filters this involves prior knowledge of the cross-correlation between the observed data and the desired waveform ($R_{dx}$), and the autocorrelation of the observed data ($R_{xx}$). The recursive implementation requires, in addition, the autocorrelation of the output ($R_{yy}$), the cross-correlation of the output and the input ($R_{xy}$), and the cross-correlation of the output with the desired waveform ($R_{dy}$). Output statistics are not usually examined. Nonetheless, the set of statistics at the Wiener filter output does not exist and it is assumed, for the moment, that they are known, and will be used to determine the weights in the feed-forward and feed-back filters. The statistics for the fixed parameter network are not a function of the weights, but instead the weights are a function of these statistics. Therefore, $R_{xy}$, $R_{dx}$, and $R_{yy}$ are constants when differentiating with respect to the vectors A and B.

The set of weights that minimize the mean square error is found by setting the gradient vector $\nabla$ equal to zero with respect to the filter parameters, as indicated by the following equations.

function of these statistics. Therefore, $R_{xy}$, $R_{dx}$, and $R_{yy}$ are constants when differentiating with respect to the vectors A and B.

The set of weights that minimize the mean square error is found by setting the gradient vector $\nabla$ equal to zero with respect to the filter parameters, as indicated by the following equations.

$$\nabla_A [E(\epsilon^2(n))] = 2 R_{xx} A - 2 R_{dx} + 2 R_{xy} B = 0, \text{ to derive } A = R_{xx}^{-1}(R_{dx} - R_{xy} B), \text{ and} \quad (11)$$

$$\nabla_B [E(\epsilon^2(n))] = 2 R_{yy} B - 2 R_{dy} + 2 R_{xy}^T A = 0, \text{ to derive } B = R_{yy}^{-1}(R_{dy} - R_{xy}^T A) \quad (12)$$

Thus, the filter coefficients of the canonical filter can be determined, if all the second order statistics are known. These statistics are not known in general, and the matrix inversions ($R_{xx}^{-1}$ and $R_{yy}^{-1}$) are not easily manipulated even if the matrices are known.

The adaptive recursive least mean square error filter of FIG. 2 is made adaptive to estimate the unknown second order statistics, and made iterative to converge to the desired weighting coefficients (of equations 11 and 12) on the average.

An iterative gradient search technique (the method of steepest descent) is utilized to achieve the least mean square error criterion, because this method is one of the standard mathematical tools used to make systems change with time. This method of steepest descent updates the filter coefficients with steps proportional to the gradient vector $\nabla$, as indicated by the following equations.

$$A(n+1) = A(n) + k_1 \nabla_A [E(\epsilon^2(n))] = A(n) + 2 k_1 [R_{xx} A(n) - R_{dx} + R_{xy} B(n)] \quad (13)$$

$$B(n + 1) = B(n) + k_2 \nabla_B [E(\epsilon^2(n))] = B(n) + 2k_2 \\ [R_{yy}B(n) - R_{dy} + R_{xy}{}^T A(n)] \quad (14)$$

The vectors $A(n)$ and $B(n)$ are the columns of variable weighting coefficients in the feed-forward and feedback filters 21 and 23, respectively, at time interval $n$, as indicated by the following equations:

$$A(n) = \begin{bmatrix} a_0(n) \\ a_1(n) \\ \vdots \\ a_{N_A}(n) \end{bmatrix} \text{ and } B(n) = \begin{bmatrix} b_1(n) \\ b_2(n) \\ \vdots \\ b_{N_B}(n) \end{bmatrix} \quad (15)$$

These iterations would converge to the desired values if the covariance matrices were known. The least mean square algorithm replaces the unknown matrices with instantaneous estimates of their values. The a-priori statistic $R_{xx}$ is estimated by $X(n) X^T(n)$ at the nth iteraction. Similarly $R_{dx}$ is estimated by $d(n)X(n)$, $R_{xy}$ by $X(n) Y^T(n)$, $R_{dy}$ by $d(n)Y(n)$, and $R_{yy}$ by $Y(n)Y^T(n)$, as applied in the following equations 16 and 17:

$$A(n + 1) = A(n) + 2k_1 [X(n)X^T(n)A(n) - d(n) X(n) \\ + X(n)Y^T(n)B(n)] = A(n) + 2k_1 \epsilon(n) X(n) \quad (16)$$

$$B(n+1) = B(n) + 2k_2 [Y(n)Y^T(n)B(n) + d(n)Y(n) + \\ Y(n)X(n)^T A(n)] = B(n) + 2k_2 \epsilon(n) Y(n) \quad (17)$$

The adaptive recursive filter output can therefore be expressed as $$y(n) = X^T(n)A(n) + Y^T(n)B(n) \\ = \sum_{i=0}^{N_A} a_i(n) x(n-1) + \sum_{j=1}^{N_B} b_j(n) y(n-j) \quad (18)$$

It should be noted that, while no timing circuits or clock pulses are shown, the utilization of clock pulses to perform the operation indicated in FIG. 2 should be well known or apparent to those skilled in the art.

The invention thus provides an improved adaptive recursive filter, which utilizes the least mean square error criterion, in conjunction with observations of input data to automatically update tap weights or filter coefficients by using a simple iterative gradient search procedure in order to minimize the mean square error of the output data of the adaptive recursive filter. In the adaptive recursive filter of the invention, the input and output data are respectively applied to the inputs of first and second transversal filters. The summation of the output signals from the first and second transversal filters develops the output data of the adaptive recursive filter. The subtraction of the output data from a preselected desired waveform or signal develops an error signal. In one embodiment of the invention, a function of the error signal is commonly utilized to update the tap weights or filter coefficients in both of the first and second transversal filters. In a second embodiment of the invention, first and second functions of the error signal are respectively utilized by the first and second transversal filters to update all of the tap weights in the respective filters. In a third embodiment of the invention, the error signal itself is used to update all of the filter coefficients in both the first and second transversal filters.

While the salient features have been basically illustrated and described in relation to three embodiments of the invention, it should be readily apparent to those skilled in the art that many changes and modifications can be made in these embodiments without departing from the spirit and scope of the invention. It is therefore intended to cover all such changes and modifications of the invention that fall within the spirit and scope of the invention as set forth in the appended claims.

What is claimed is:

1. An adaptive filter comprising:
   first means for receiving a first input signal;
   a first adaptive transversal filter, coupled to said first means, being responsive to the first input signal for developing a first filter signal;
   a second adaptive transversal filter responsive to an output signal of the adaptive recursive filter for developing a second filter signal;
   second means for combining the first and second filter signals to form said output signal;
   third means for receiving the second input signal;
   fourth means coupled to said second and third means for combining the second input signal with the output signal to generate an error signal; and
   fifth means responsive to the error signal for causing said first and second transversal filters to adaptively modify the first and second filter signals to minimize the mean square error in the output signal.

2. The adaptive recursive filter of claim 1 wherein said means includes:
   sixth and seventh means respectively responsive to first and second scalars and commonly responsive to the error signal for respectively developing first and second functions of the error signal, said first and second transversal filters being respectively responsive to said first and second functions of the error signal for automatically adapting themselves to respectively modify the first and second filter signals to minimize the mean square error in the output signal.

3. The adaptive recursive filter of claim 1 wherein said fifth means includes:
   sixth means responsive to a preselected scalar and to the error signal for developing one function of the error signal, said first and second transversal filters being responsive to the function of the error signal for automatically adapting themselves to modify the first and second filter signals to minimize the mean square error in the output signals.

4. The adaptive recursive filter of claim 1 wherein:
   said fifth means develops a function of the error signal equal to the error signal, said first and second transversal filters being responsive to said function of the error signal for automatically adapting themselves to modify the first and second filter signals to minimize the mean square error in the output signal.

5. The adaptive recursive filter of claim 1 wherein each of said first and second transversal filters includes:
   a delay line having a plurality of taps for delaying the associated one of the input and output data signals applied thereto so that a plurality of differently delayed data signals is respectively developed at the plurality of taps;
   a summing circuit for summing a plurality of updated terms to develop the associated one of the first and second signal; and
   a plurality of sixth means respectively coupled to said plurality of taps, said plurality of sixth means being responsive to a function of the error signal and also being respectively responsive to the plurality of differently delayed data signals for developing the plurality of updated terms.

6. The adaptive recursive filter of claim 5 wherein said of said sixth means includes:
a first multiplier responsive to the function of the error signal and to an associated one of the differently delay data signals for developing a first product signal;
means for summing the first product signal with a presently updated signal component to develop a summed signal;
means for applying the summed signal to develop the next updated signal component; and
a second multiplier responsive to the presently updated signal component and to the associated one of the differently delayed data signals for developing an associated said updated term.

7. A machine method for rendering a recursive filter adaptive comprising the steps of:
combining the filter output signal with a first input signal to develop an error signal; and
utilizing the filter output signal, a second input signal and the error signal to enable the filter to automaticaly adapt itself to minimize the mean square error in the filter output signal.

8. A machine method for enabling a recursive filter to automatically adapt comprising the steps of:
combining the filter output signal with a first input signal to develop an error signal;
generating a function of the error signal; and
enabling the filter to minimize the mean square error in the output signal in response to a second input signal, the output signal and to the function of the error signal.

9. A machine method for causing a recursive filter to automatically adapt comprising the steps of:
combining a first input signal with the output signal from the recursive filter to develop an error signal;
scaling the error signal; and
applying a second input signal, the output signal and the scaled error signal to the filter to enable the filter to automatically adapt itself to minimize the mean square error in the ouput signal.

10. A machine method for enabling a recursive filter to automatically adapt comprising the steps of:
combining the output signal of the filter with a first input signal to develop an error signal;
developing at last one function signal from the error signal;
utilizing a second input signal, the output signal and said at least one function signal to cause the recursive filter to automatically adapt itself to minimize the mean square error in the output signal.

11. The machine method of claim 10 wherein:
said developing step consists of generating first and second function signals from the error signal; and
said utilizing step consists of using both the first and second function signals to enable the recursive filter to automatically adapt itself to minimize the mean square error in the output signal.

12. The machine method of claim 10 wherein:
said developing step consists of generating one function
said developing step consists of generating one function signal from the error signal; and
said utilizing step consists of using the one function signal to enable the recursive filter to automatically adapt itself to minimize the mean square error in the output signal.

13. The machine method of claim 12 wherein:
said generating step consists of making the one function signal equal to the error signal.

14. A machine method for making a recursive filter adaptive comprising the steps of:
providing a first input signal to a first transversal filter;
combining the output of the first transversal filter with the output of a second transversal filter to develop the output signal to the recursive filter;
feeding back the output signal to the second transversal filter;
enabling a second input signal to be combined with the output signal to develop an error signal;
utilizing the error signal to develop at least one function signal; and
applying said at least one function signal to the first and second transversal filter to enable the first and second transversal filters to automatically adapt themselves to minimize the mean square error in the output signal.

15. The machine method of claim 14 wherein:
said utilizing step consists of generating first and second function signals from the error signal; and
said applying step consists of sending the first and second function signals to the first and second transversal filters respectively to enable the first and second transversal filters to automatically adapt themselves to minimize the mean square error of the output signal.

16. The machine method of claim 14 wherein:
said utilizing step consists of generating only one function signal from the error signal; and
said applying step consists of using the one function signal to enable both of the first and second transversal filters to automatically adapt themselves to minimize the mean square error in the output signal.

17. The method of claim 16 wherein:
the generating step consists of making the function signal equal to the error signal.

* * * * *